United States Patent
Zhu et al.

(10) Patent No.: US 11,930,673 B2
(45) Date of Patent: Mar. 12, 2024

(54) DISPLAY PANEL AND DISPLAY DEVICE

(71) Applicant: BOE TECHNOLOGY GROUP CO., LTD., Beijing (CN)

(72) Inventors: Zhijian Zhu, Beijing (CN); Yu Ao, Beijing (CN); Yunlong Li, Beijing (CN); Pengcheng Lu, Beijing (CN); Yuanlan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 598 days.

(21) Appl. No.: 17/258,762

(22) PCT Filed: Mar. 27, 2020

(86) PCT No.: PCT/CN2020/081878
§ 371 (c)(1),
(2) Date: Jan. 8, 2021

(87) PCT Pub. No.: WO2021/189494
PCT Pub. Date: Sep. 30, 2021

(65) Prior Publication Data
US 2022/0140047 A1 May 5, 2022

(51) Int. Cl.
*H10K 59/131* (2023.01)

(52) U.S. Cl.
CPC ................. *H10K 59/131* (2023.02)

(58) Field of Classification Search
CPC ...... H10K 59/131; H10K 59/17; H10K 59/32; H10K 59/35; H10K 59/50; H10K 59/65;
(Continued)

(56) References Cited

U.S. PATENT DOCUMENTS

| 7,812,914 B2 | 10/2010 | Fujikawa |
| 8,102,497 B2 | 1/2012 | Fujikawa |

(Continued)

FOREIGN PATENT DOCUMENTS

| CN | 103676251 A | 3/2014 |
| CN | 103838043 A | 6/2014 |

(Continued)

OTHER PUBLICATIONS

Communication from European Application No. 10900712.9 dated Mar. 27, 2023.

(Continued)

*Primary Examiner* — Brook Kebede
(74) *Attorney, Agent, or Firm* — Calfee, Halter & Griswold LLP

(57) ABSTRACT

A display panel includes a drive backplane, a transparent insulating layer and a light-emitting device layer. The drive backplane includes a driving circuit layer, a metal wiring layer, a first insulating layer and a reflective electrode layer. The first insulating layer has first via holes filled with first metal connectors. The reflective electrode layer includes first reflective electrodes respectively connected with the metal wiring layer through the first metal connectors. The light-emitting device layer includes a pixel electrode layer, an organic light-emitting layer and a common electrode layer. The pixel electrode layer includes first pixel electrodes respectively connected with the first reflective electrodes through the connection via holes. A distance between an orthographic projection of the connection via hole on the pixel electrode layer and an edge of the first pixel electrode is not less than a first threshold value.

19 Claims, 7 Drawing Sheets

(58) Field of Classification Search
CPC ....... H10K 59/80516; H10K 59/80517; H10K 59/80518; H10K 59/82; H10K 59/8731
See application file for complete search history.

(56) References Cited

U.S. PATENT DOCUMENTS

| | | | |
|---|---|---|---|
| 8,456,602 | B2 | 6/2013 | Fujikawa |
| 9,696,582 | B2 | 7/2017 | Choi |
| 10,013,928 | B2 | 7/2018 | Horade |
| 10,270,054 | B2 | 4/2019 | Zhang |
| 2003/0042849 | A1* | 3/2003 | Ogino .................... H10K 71/13 313/504 |
| 2009/0218569 | A1 | 9/2009 | Fujikawa |
| 2011/0025971 | A1 | 2/2011 | Fujikawa |
| 2012/0154261 | A1 | 6/2012 | Fujikawa |
| 2015/0187989 | A1* | 7/2015 | Sato ...................... H10K 59/38 257/98 |
| 2016/0070396 | A1 | 3/2016 | Horade |
| 2016/0077378 | A1 | 3/2016 | Choi |
| 2017/0236891 | A1 | 8/2017 | Koshihara et al. |
| 2017/0277308 | A1 | 9/2017 | Zeng |
| 2018/0102403 | A1 | 4/2018 | Koshihara et al. |
| 2018/0315948 | A1 | 11/2018 | Zhang |
| 2019/0180692 | A1 | 6/2019 | Fujii et al. |
| 2021/0074790 | A1 | 3/2021 | Wang et al. |
| 2021/0091158 | A1 | 3/2021 | Kasahara |
| 2021/0201811 | A1 | 7/2021 | Fujii et al. |
| 2022/0190076 | A1 | 6/2022 | Kasahara |
| 2023/0017349 | A1 | 1/2023 | Fujii et al. |

FOREIGN PATENT DOCUMENTS

| | | |
|---|---|---|
| CN | 203720494 U | 7/2014 |
| CN | 104062791 A | 9/2014 |
| CN | 104932765 A | 9/2015 |
| CN | 106252525 A | 12/2016 |
| CN | 104062791 B | 1/2017 |
| CN | 107086238 A | 8/2017 |
| CN | 206584328 U | 10/2017 |
| CN | 109545934 A | 3/2019 |
| CN | 109545934 B | 5/2020 |
| CN | 114447087 A | 5/2022 |
| EP | 2933678 A1 | 10/2015 |
| EP | 2933678 B1 | 3/2018 |
| EP | 3506379 A1 | 7/2019 |
| JP | 2014096568 A | 5/2014 |
| JP | 2017146336 A | 8/2017 |
| JP | 2017146369 A | 8/2017 |
| JP | 2019531572 A | 10/2019 |
| TW | 201740559 A | 11/2017 |
| WO | 2007034599 A1 | 3/2007 |
| WO | 2015078153 A1 | 6/2015 |
| WO | 2019026511 A1 | 2/2019 |
| WO | 2019214590 A1 | 11/2019 |

OTHER PUBLICATIONS

Written Opinion from PCT/CN2020/081878 dated Jan. 4, 2021.
Office action from Japanese Application No. 2021-568597 dated Nov. 20, 2023.

* cited by examiner

DISPLAY PANEL AND DISPLAY DEVICE

CROSS REFERENCE

The present disclosure is based on International Application No. PCT/CN2020/081878, filed on Mar. 27, 2020, and the entire contents thereof are incorporated herein by reference.

TECHNICAL FIELD

This disclosure relates to the field of display technology, in particular to a display panel and a display device.

BACKGROUND

Compared with DMD (Digital Micromirror Device) and LCOS (Liquid Crystal on Silicon) microdisplays, silicon-based OLED microdisplays have extremely excellent display characteristics. The OLED provides excellent user experience due to high brightness, rich colors, low driving voltage, fast response speed and low power consumption thereof. And the OLED is an all-solid-state device with a good anti-vibration performance and a wide working temperature range (−40° C.-85° C.); and pertains to a self-light-emitting device, does not need a backlight, has a wide view range, and is thin, so that it is beneficial to reduce a system volume, particularly suitable for a near-eye display system.

However, the silicon-based OLED microdisplays generally have very small pixel sizes, and the anode disconnection is easy to occur during a preparation process.

It should be noted that information disclosed in this part are provided only for acquiring a better understanding of the background of the present application and therefore may include information that is not current technology already known to those of ordinary skill in the art.

SUMMARY

According to an aspect of the present disclosure, it is provided with a display panel, which includes
  a drive backplane including a driving circuit layer, a metal wiring layer, a first insulating layer and a reflective electrode layer sequentially laminated; in which the first insulating layer has a plurality of first via holes, and each of the first via holes is provided with a first metal connector; the reflective electrode layer comprises a plurality of first reflective electrodes which are respectively electrically connected with the metal wiring layer through the first metal connector;
  a transparent insulating layer at a side of the reflective electrode layer far away from the driving circuit layer; in which the transparent insulating layer has a plurality of connection via holes corresponding to the first reflective electrodes one by one, and any one of the connection via holes exposes part of a surface of corresponding one of the first reflective electrodes;
  a light-emitting device layer including a pixel electrode layer, an organic light-emitting layer and a common electrode layer sequentially laminated at a side of the transparent insulating layer far away from the reflective electrode layer; in which the pixel electrode layer comprises first pixel electrodes corresponding to a plurality of the connection via holes one by one, and each of the first pixel electrodes is connected with a corresponding one of the first reflecting electrodes through a corresponding one of the connection via holes;
  wherein an orthographic projection of the connection via hole on the pixel electrode layer is located within a corresponding one of the first pixel electrodes; a minimum value of a distance between any point of the orthographic projection of the connection via hole on the pixel electrode layer and any point of an edge of the corresponding one of the first pixel electrode is not less than a first threshold value; and the first threshold value is between 0.13 times and 1.3 times of a distance between two adjacent ones of the first pixel electrodes.

In an exemplary embodiment of the present disclosure, the minimum value of the distance between any point of the orthographic projection of the connection via hole on the pixel electrode layer and any point of an edge of the corresponding one of the first pixel electrode is equal to the first threshold value.

In an exemplary embodiment of the present disclosure, the first pixel electrode at least has a first edge and a second edge adjacent to each other; the minimum value of the distance between any point of the orthographic projection of the connection via hole on the pixel electrode layer and any point of a first edge of a corresponding one of the first pixel electrodes is equal to the first threshold value; and the minimum value of the distance between any point of the orthographic projection of the connection via hole on the pixel electrode layer and any point of a second edge of a corresponding one of the first pixel electrodes is equal to the first threshold value.

In an exemplary embodiment of the present disclosure, an orthographic projection of the first metal connector electrically connected to the first pixel electrode on the pixel electrode layer is located within the first pixel electrode and does not completely overlap with the orthographic projection of the connection via hole on the pixel electrode layer.

In an exemplary embodiment of the present disclosure, a minimum value of a distance between any point of the orthographic projection of the connection via hole on the pixel electrode layer and any point of the edge of the corresponding one of the first pixel electrode is equal to the first distance;
  a minimum value of the distance between any point of the orthographic projection of the first metal connector on the pixel electrode layer and any point of the edge of the first pixel electrode electrically connected to the first metal connector is equal to a second distance; and
  the second distance is smaller than the first distance.

In an exemplary embodiment of the present disclosure, a minimum value of a distance between any point on an edge of the first pixel electrode and a center of the first pixel electrode is a third distance; and
  the first threshold value is within a range of 5%-8% of the third distance.

In an exemplary embodiment of the present disclosure, an orthographic projection of the first metal connector on the pixel electrode layer is located within the first pixel electrode electrically connected to the first metal connector; a minimum value of a distance between any point of the orthographic projection of the first metal connector on the pixel electrode layer and any point of the edge of the first pixel electrode electrically connected to the first metal connector is not greater than a second threshold value; and the second threshold value is less than the first threshold value.

In an exemplary embodiment of the present disclosure, an orthographic projection of the first pixel electrode on the driving circuit layer is a centrally symmetrical hexagon, and each of the first pixel electrodes is arranged in a honeycomb shape; the first pixel electrodes form a plurality of first pixel electrode rows along a row direction;

the first pixel electrode comprises two first side walls arranged opposite to one another and four second side walls connected with two said first side walls; two said first side walls are perpendicular to the row direction; four said second side walls enclose a first vertex angle and a second vertex angle arranged opposite to one another;

a minimum value of the distance between any point of the orthographic projection of the connection via hole on the corresponding one of the first pixel electrodes and any point on any one of the two said second side walls of the first vertex angle of the first pixel electrode is equal to the first threshold value.

In an exemplary embodiment of the present disclosure, an orthographic projection position of the first metal connector electrically connected to one of the first pixel electrodes on the first pixel electrode has a symmetrical relationship between two adjacent ones of the first pixel electrodes of the first pixel electrode row.

In an exemplary embodiment of the present disclosure, the orthogonal projection position of the connection via hole on the corresponding one of the first pixel electrodes is arranged in the same way in the two adjacent ones of the first pixel electrodes of the first pixel electrode row.

In an exemplary embodiment of the present disclosure, the pixel electrode layer comprises a first titanium metal layer, a first aluminum metal layer, a second titanium metal layer and a molybdenum metal layer sequentially laminated on a surface of the transparent insulating layer far away from the driving circuit layer; wherein the first titanium metal layer has a thickness of 80-120 angstroms, the first aluminum metal layer has a thickness of 400-500 angstroms, the second titanium metal layer has a thickness of 40-60 angstroms, and the molybdenum metal layer has a thickness of 40-60 angstroms.

In an exemplary embodiment of the present disclosure, the reflective electrode layer comprises a third titanium metal layer, a second aluminum metal layer and a titanium nitride layer sequentially laminated on a surface of the first insulating layer far away from the metal wiring layer; wherein the third titanium metal layer has a thickness of is 80-120 angstroms, the second aluminum metal layer has a thickness of 700-900 angstroms, and the titanium nitride layer has a thickness of 80-120 angstroms.

In an exemplary embodiment of the present disclosure, a diameter of the connection via hole is 0.2-0.4 microns.

According to a second aspect of the present disclosure, it is provided with a display device including the display panel mentioned above.

BRIEF DESCRIPTION OF THE DRAWINGS

The above-described and other features and advantages of the present disclosure will become more apparent from the detailed descriptions of exemplary embodiments with reference with the accompanying drawings.

DETAILED DESCRIPTION

Figure 1:
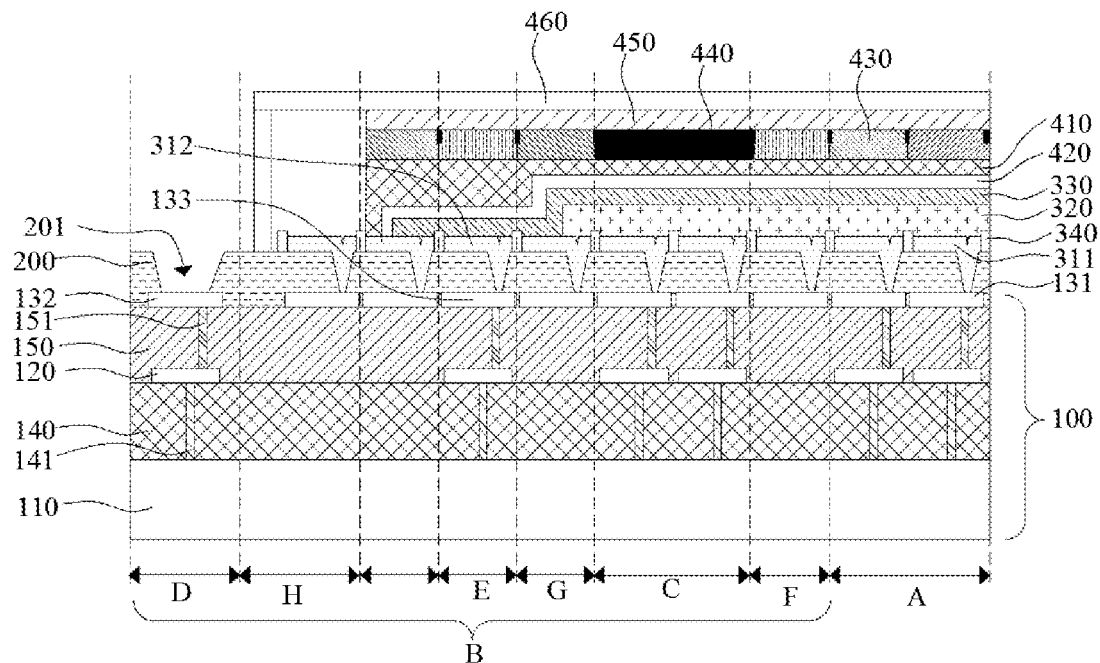
FIG. 1 is a schematic sectional structure view of a display panel according to an embodiment of the present disclosure.

The exemplary embodiments will now be described more fully with reference to the accompanying drawings. However, the exemplary embodiments can be implemented in various forms and should not be understood as being limited to the examples set forth herein; instead, these embodiments are provided so that this disclosure will be thorough and complete, and the conception of exemplary embodiments will be fully conveyed to those skilled in the art. The above-described features, structures or characteristics may be combined in one or more embodiments in any suitable way. Wherever possible, features discussed in each embodiment are interchangeable. In the foregoing description, numerous specific details are provided to acquire a full understanding of embodiments of the present disclosure.

In the drawings, thicknesses of regions and layers may be exaggerated for sake of clarity. Same reference numbers denote the same or similar structures in the figures, and thus the detailed description thereof will be omitted.

The above-described features, structures or characteristics may be combined in one or more embodiments in any suitable way. In the foregoing description, numerous specific details are provided to acquire a full understanding of embodiments of the present disclosure. However, those skilled in the art will recognize that technical solutions of the present disclosure may be practiced without one or more of the specific details, or, other methods, components, materials and the like may be used. In other cases, well-known structures, materials or operations are not shown or described in detail to avoid obscuring main technical ideas of the present disclosure.

When a structure is described as "above" another structure, it probably means that the structure is integrally formed on another structure, or, the structure is "directly" disposed on another structure, or, the structure is "indirectly" disposed on another structure through an additional structure.

The terms "a", "an" and "the", "said" are used to express the presence of one or more the element/constitute/or the like. The terms "comprise", "include" and "have" are intended to be inclusive, and mean there may be additional elements/constituents/or the like other than the listed elements/constituents/or the like. The "first" and "second" are used only as marks, and are not numerical restriction to the objects.

The present disclosure provides a display panel, as shown in FIG. 1, which includes a drive backplane 100, a transparent insulating layer 200 and a light-emitting device layer.

Figure 4:
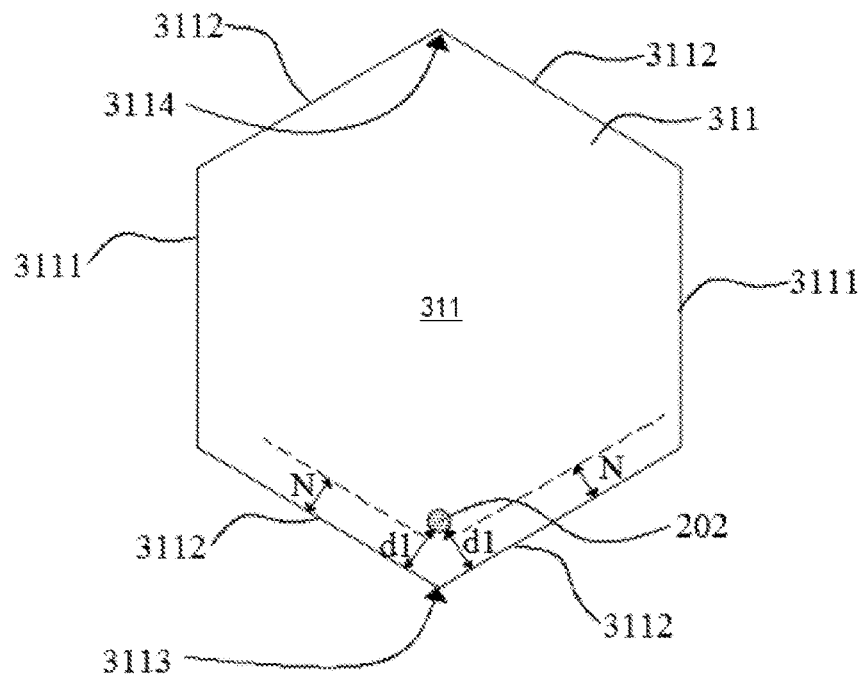
FIG. 4 is a schematic projection view of a first pixel electrode and a connection via according to an embodiment of the present disclosure.
Figure 5:
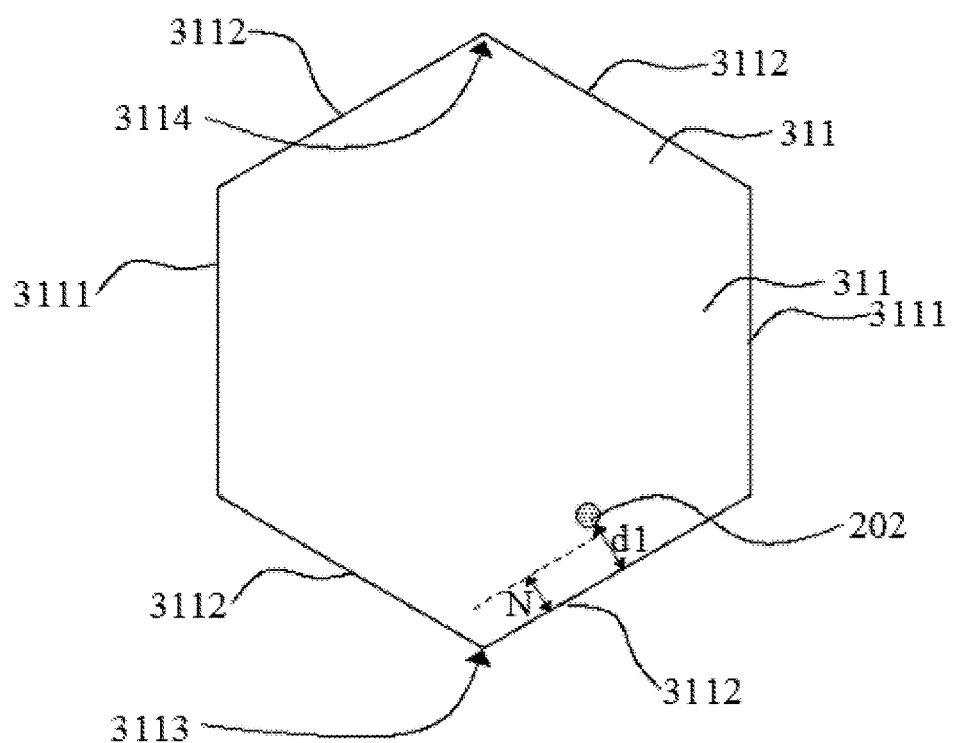
FIG. 5 is a schematic projection view of another first pixel electrode and a connection via according to an embodiment of the present disclosure.

The drive backplane 100 includes a driving circuit layer 110, a metal wiring layer 120, a first insulating layer 150 and a reflective electrode layer sequentially laminated. The first insulating layer 150 has a plurality of first via hole. The first metal connector 151 is disposed in each of the first via holes. The reflective electrode layer includes a plurality of first reflective electrodes 131, and each first reflective electrode 131 is electrically connected with the metal wiring layer 120 through respective corresponding first metal connector 151. The transparent insulating layer 200 is disposed at a side of the reflective electrode layer far away from the driving circuit layer 110. The transparent insulating layer 200 has a plurality of connection via holes 202 corresponding to the respective first reflective electrodes 131 one by one, and each of the connection via holes 202 exposes a part of the surface of the corresponding first reflective electrode 131. The light-emitting device layer is disposed at a side of the transparent insulating layer 200 far away from the driving circuit layer 110, and includes a pixel electrode layer, an organic light-emitting layer 320 and a common electrode layer 330 which are sequentially laminated. The pixel electrode layer includes first pixel electrodes 311 corresponding to a plurality of connection via holes 202 one by one, and the first pixel electrodes 311 are connected with the corresponding first reflective electrodes 131 through the corresponding connection via holes 202. As shown in FIGS. 4 and 5, an orthographic projection of the connection via hole 202 on the pixel electrode layer is located within the corresponding first pixel electrode 311. A minimum value d1 of a distance between any point of the orthographic projection of the connection via hole 202 on the pixel electrode layer and any point of an edge of the corresponding first pixel electrode 131 is not less than a first threshold value N. The first threshold value N is between 0.13 times and 1.3 times of the distance between two adjacent ones of the first pixel electrodes 131.

In the display panel provided by the present disclosure, the first threshold value N may be determined according to an interval of the first pixel electrodes, so that the orthographic projection of the connection via hole on the pixel electrode layer does not contact with an edge of the first reflective electrode. As such, when the first pixel electrode is prepared by a patterning operation, even if alignment offset occurs, it is not easy to etch a pixel electrode material in the connection via hole 202, so as to reduce a risk that the orthographic projection of the connection via hole 202 on the pixel electrode layer is not completely located in the corresponding first pixel electrode 311, and thus avoid the defect of resistance increase or open circuit between the first pixel electrode 311 and the first reflective electrode 131 caused by etching a conductive material in the connection via hole 202, and can improve a yield of the display panel and enlarge a process window for the preparation of the pixel electrode layer. Especially, by using the first threshold value N, the orthographic projection of the connection via hole 202 on the first pixel electrode 311 is close to the edge of the first pixel electrode 311 as possible without contacting with the edge of the first reflective electrode, so that an uneven surface of the first pixel electrode 311 is close to the edge of the first pixel electrode 311 as possible, so as to reduce influence of the connection via hole 202 on luminous uniformity of the light-emitting devices and achieve a balance between ensuring the light-emitting effect of light-emitting devices and improving the yield of the display panels.

Hereinafter, the structure, principle and effect of the display panel provided by this disclosure will be further explained and illustrated with reference to the figures.

Figure 2:
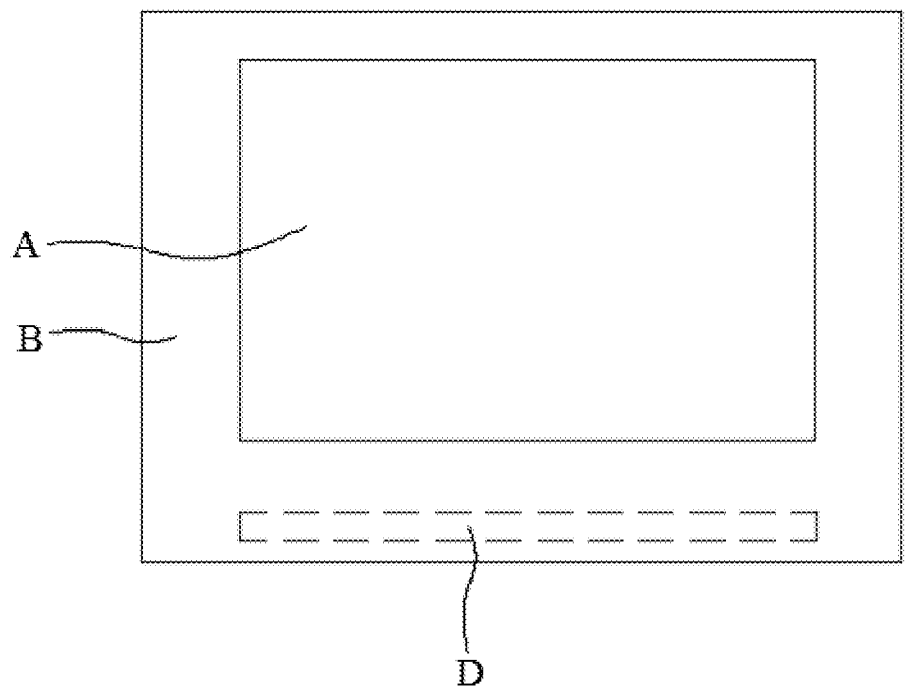
FIG. 2 is a schematic structural view of a display panel according to an embodiment of the present disclosure.

Referring to FIGS. 1 and 2, the display panel provided by the present disclosure may include a display area A and a peripheral area B surrounding the display area A. The display panel may include a drive backplane 100, a transparent insulating layer 200 and a light-emitting device layer which are sequentially laminated, wherein the drive backplane 100 may include a driving circuit layer 110, a metal wiring layer 120, a first insulating layer 150, and a reflective electrode layer which are sequentially laminated.

A plurality of transistors and storage capacitors may be formed on the driving circuit layer 110, and the transistor and the storage capacitor may be electrically connected to form a driving circuit. In an embodiment of the present disclosure, the transistors may include N-type transistors and P-type transistors; as such, the driving circuit layer 110 may be prepared with reference to a CMOS process.

For example, the driving circuit layer 110 may include a silicon-based semiconductor layer, an insulating layer and a lead layer, wherein a channel region, a source electrode and a drain electrode of the driving transistor may be formed on the silicon-based semiconductor layer; the lead layer may form a gate electrode for driving the transistors; and the insulating layer may isolate the channel region and the gate electrode for driving the transistors. The storage capacitors may be formed on the silicon-based semiconductor layer and the lead layer, or may be formed between the different lead layers. The lead layer may also form a connection lead for connecting the storage capacitor and a thin film transistor, so that the transistor and the storage capacitor are connected to form a driving circuit.

As shown in FIG. 1, a second insulating layer 140 and a second metal connector 141 penetrating through the second insulating layer 140 may be disposed between the metal wiring layer 120 and the driving circuit layer 110, and the second metal connector 141 connects the driving circuit layer 110 and the metal wiring layer 120. The second insulating layer 140 may use an organic or inorganic insulating material. In an embodiment of the present disclosure, the second insulating layer 140 may use silicon oxide, silicon nitride, silicon oxynitride, aluminum nitride, aluminum oxide, silicon glass or other inorganic insulating materials. A second via hole may be formed on the second insulating layer 140, and exposes at least part of the metal layer of the driving circuit layer 110. The second metal connector 141 may be embedded in the second via hole such that the metal wiring layer 120 is electrically connected to the driving circuit layer 110.

Materials of the second metal connector 141 may be metal materials such as titanium, tungsten and copper. In an embodiment of the present disclosure, the second insulating layer 140 and the second metal connector 141 may be formed by following steps of forming a FSG (Fluorinated Silicate Glass) layer on a surface of the driving circuit layer 110, and then forming a second via hole on the FSG layer; filling metal tungsten in the second via hole, and then forming a second metal connector 141 composed of the metal tungsten by a CMP (Chemical Mechanical Polishing) process.

Optionally, a thickness of the second insulating layer 140 may be 8-12 microns, so that there is a large distance between the metal wiring layer 120 and the driving circuit layer 110, to reduce the influence of the electrical signals on the metal wiring layer 120 on various devices of the driving circuit layer 110 and improve the working stability of the driving circuit layer 110. In an embodiment of the present disclosure, the thickness of the second insulating layer 140 may be 10 microns.

A first insulating layer 150 and a first metal connector 151 penetrating through the first insulating layer 150 are disposed between the metal wiring layer 120 and the reflective electrode layer, and the first metal connector 151 connects the metal wiring layer 120 and the reflective electrode layer.

The first insulating layer 150 may use an organic or inorganic insulating material. In an embodiment of the present disclosure, the first insulating layer 150 may use silicon oxide, silicon nitride, silicon oxynitride, aluminum nitride, aluminum oxide, silicon glass or other inorganic insulating materials. A first via hole is formed on the first insulating layer 150, and exposes at least part of the metal wiring layer 120. Optionally, the first insulating layer 150 may also be processed by the CMP process to provide a planarization surface for the reflective electrode layer, improve flatness of the first reflective electrode 131, and further improve the reflective effect of the first reflective electrode 131.

The first metal connector 151 may be embedded in the first via hole to connect the metal wiring layer 120 and the first reflective electrode 131. The material of the first metal connector 151 may be metal materials such as titanium, tungsten and copper. In an embodiment of the present disclosure, the first insulating layer 150 and the first metal connector 151 may be formed by following methods of forming a USG (Undoped Silicate Glass) layer on a surface of the metal wiring layer 120 far away from the driving circuit layer 110, and then forming a first via hole on the USG layer; filling the first via hole with tungsten metal, and then forming a first metal connector 151 composed of the tungsten metal by a CMP (Chemical Mechanical Polishing) process, and forming a planarized first insulating layer 150.

Optionally, a diameter of the first via hole may be 0.140-0.324 microns, and is subjected to effectively fill the conductive material of the first metal connector 151 and meet the impedance requirements of the display panel for the first metal connector 151.

Optionally, a thickness of the first insulating layer 150 may be 6-10 microns, so that there is a large distance between the reflective electrode layer and the metal wiring layer 120, to reduce the interference of the electrical signals on the first reflective electrode 131 on the metal wiring layer 120. In an embodiment of the present disclosure, the thickness of the first insulating layer 150 may be 8 microns.

The reflective electrode layer is disposed on a surface of the first insulating layer 150 far away from the driving circuit layer 110, and may be one or more layers of conductive materials. Optionally, the reflective electrode layer may include an aluminum metal layer with good conductive performance and high reflectivity, and the protective layer may be provided on both sides of the aluminum metal layer, respectively. Optionally, the reflective electrode layer may include a third titanium metal layer, a second aluminum metal layer and a titanium nitride layer sequentially laminated on the surface of the first insulating layer 150, wherein the thickness of the third titanium metal layer may be 80-120 angstroms, the thickness of the second aluminum metal layer may be 700-900 angstroms, and the thickness of the titanium nitride layer may be 80-120 angstroms.

Figure 3:
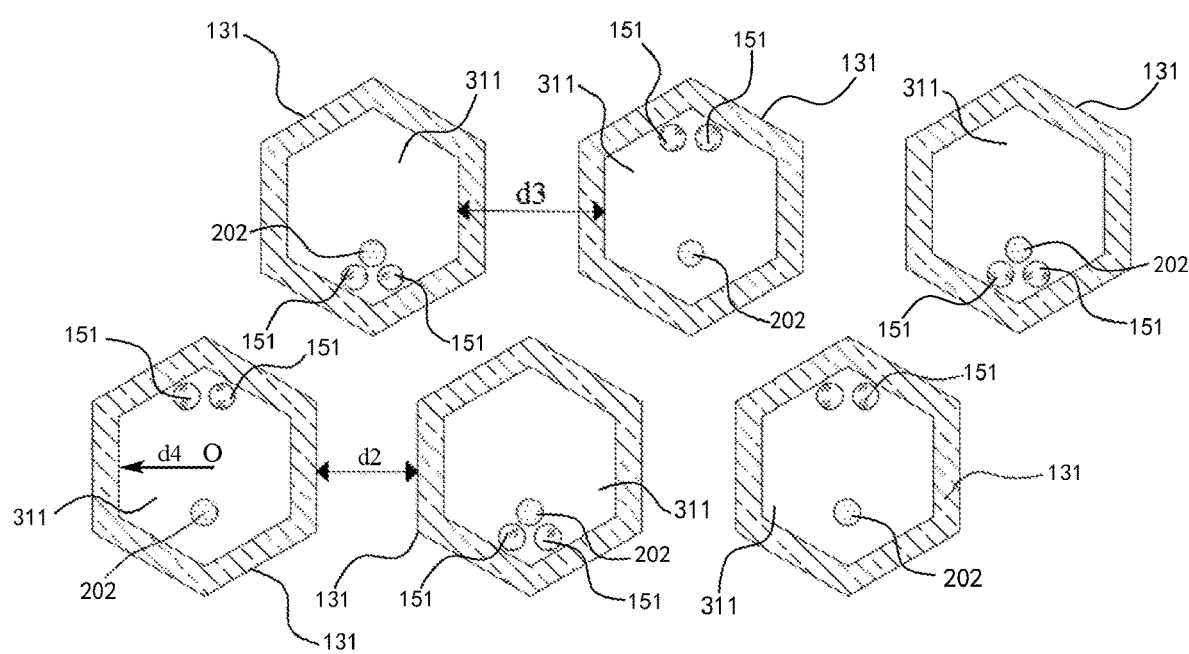
FIG. 3 is a schematic projection view of a first reflective electrode, a first pixel electrode, a first metal connector and a connection via hole according to an embodiment of the present disclosure.

The reflective electrode layer may include a plurality of first reflective electrodes 131, and each first reflective electrode 131 may be electrically connected with the metal wiring layer 120 through the first metal connector 151. Optionally, the first reflective electrodes 131 have completely the same size and pattern, as such, the etching uniformity can be ensured when the first reflective electrodes 131 are formed by etching and etching accuracy of the first reflective electrodes 131 can be improved. Optionally, as shown in FIG. 3, the first reflective electrode 131 may be a centrally symmetrical hexagonal electrode.

Optionally, a distance d2 between the adjacent ones of the first reflective electrodes 131 can be reduced as much as possible to increase a coverage area of each first reflective electrode 131, especially increase an area coverage of the first reflective electrodes 131 in the display area A, so as to improve the reflection effect of the reflective electrode layer, and improve the brightness of the display panel. Optionally, the distance d2 between two adjacent ones of the first reflective electrodes 131 is 0.1-0.3 microns.

Optionally, the reflective electrode layer may be prepared by a semiconductor process in a wafer factory, so as to ensure that there is a small distance d2 between the adjacent first reflective electrodes 131, and avoid constraint of the panel factory on the preparation accuracy.

In an embodiment of the present disclosure, the reflective electrode layer may be prepared by following method of forming a reflective electrode material layer on the surface of the first insulating layer 150 far away from the driving circuit layer 110, and then patterning the reflective electrode material layer to form the reflective electrode layer.

Optionally, as shown in FIG. 3, any one of the first reflective electrodes 131 may be electrically connected with the metal wiring layer 120 through a plurality of the first metal connectors 151 to ensure the stability of the electrical connection between the first reflective electrodes 131 and the metal wiring layer 120. Optionally, any one of the first reflective electrodes 131 is electrically connected to the metal wiring layer 120 through two first metal connectors 151.

In an embodiment of the present disclosure, as shown in FIG. 3, the first reflective electrode 131 is a centrally symmetrical hexagonal electrode, and is electrically connected with the metal wiring layer 120 through two first metal connectors 151; and orthographic projections of the two first metal connectors 151 on the first reflective electrode 131 is close to vertex angles of the first reflective electrode 131. Optionally, the first pixel electrode 311 is a centrally symmetrical hexagonal electrode, and the orthographic projections of the two first metal connectors 151 on the first pixel electrode 311 are close to the vertex angles of the first pixel electrode 311. In this way, a surface unevenness of the first pixel electrode 311 probably caused by the first metal connector 151 is located at the vertex angles of the first pixel electrode 311, thereby improving uniformity of light emission of the light-emitting device.

As shown in FIG. 1, the transparent insulating layer 200 is disposed on a surface of the reflective electrode layer far away from the driving circuit layer 110, and may be an organic insulating material or an inorganic insulating material. Optionally, the transparent insulating layer 200 may use silicon oxide, silicon nitride, silicon oxynitride, aluminum nitride, aluminum oxide or other transparent insulating materials. A surface of the transparent insulating layer 200 far away from the driving circuit layer 110 may be a planarization surface, to improve the flatness of the first pixel electrode 311, so as to improve the light-emitting effect of the light-emitting device. In an embodiment of the present disclosure, the material of the transparent insulating layer 200 may be silicon oxide.

To ensure light transmittance of the transparent insulating layer 200, the thickness of the transparent insulating layer 200 may be less than 100 nanometers, for example, less than 500 angstroms. In an embodiment of the present disclosure, the thickness of the transparent insulating layer 200 may be 300-400 angstroms.

Optionally, as shown in FIG. 1 and FIG. 3, the transparent insulating layer 200 may be provided with a plurality of connection via holes 202, and the connection via holes 202 are configured to correspond to the first reflective electrodes 131 and the first pixel electrodes 311 one by one. The connection via holes 202 expose partial areas of the first reflective electrodes 131 in one-to-one correspondence. In this way, the first reflective electrodes 131 are electrically connected to the first pixel electrodes 311 in one-to-one correspondence through the connection via holes 202.

Optionally, a diameter of the connection via hole 202 is 0.2-0.4 microns, therefore it can avoid that the diameter of the connection via hole 202 is too small to effectively fill the first pixel electrode 311 with the conductive material, and that the uneven area of the first pixel electrode 311 is too large due to too large diameter of the connection via hole 202. In an embodiment of the present disclosure, the diameter of the connection via hole 202 is 0.20-0.25 microns.

As shown in FIGS. 1 and 3, the pixel electrode layer may include a plurality of first pixel electrodes 311, and the first pixel electrodes 311 may be electrically connected with the first reflective electrodes 131 in one-to-one correspondence. In a display area A, the first pixel electrode 311 may serve as an electrode of a light-emitting device. Optionally, the first pixel electrodes 311 have completely the same sizes and patterns, thereby ensuring the etching uniformity when the first pixel electrodes 311 are formed by etching and improving the etching accuracy of the first pixel electrodes 311.

Optionally, the pixel electrode layer may include one or more metal layers. In an embodiment of the present disclosure, the pixel electrode layer includes a first titanium metal layer, a first aluminum metal layer, a second titanium metal layer and a molybdenum metal layer which are sequentially laminated on a surface of the transparent insulating layer 200 far away from the driving circuit layer 110; wherein the first titanium metal layer has a thickness of 80-120 angstroms, the first aluminum metal layer has a thickness of 400-500 angstroms, the second titanium metal layer has a thickness of 40-60 angstroms, and the molybdenum metal layer has a thickness of 40-60 angstroms.

Optionally, as shown in FIG. 3, a distance d3 between the adjacent first pixel electrodes 311 may be minimized as much as possible to increase the coverage area of each first pixel electrode 311 and the area of each first pixel electrode 311, especially to increase the area of the first pixel electrode 311 in the display area A, consequently to increase a light-emitting area of the light-emitting device, and further improve a luminous brightness of the display panel, and prepare a display panel with high-brightness. Optionally, the distance d3 between two adjacent ones of the first pixel electrodes 311 is 0.6-1.0 microns.

In an embodiment of the present disclosure, the pixel electrode layer can be prepared in a panel factory. Optionally, the pixel electrode layer may be prepared by the following method of forming a pixel electrode material layer on the surface of the transparent insulating layer 200 far away from the substrate, in which the pixel electrode material layer covers each connection via hole 202 to be electrically connected with each first reflective electrode 131; and patterning the pixel electrode material layer to form a pixel electrode layer. The orthographic projection of each connection via hole 202 on the pixel electrode layer is located within the corresponding first pixel electrode 311, in this way, the first pixel electrode 311 is electrically connected to the first reflective electrode 131 through the corresponding connection via hole 202, and there is no need to specially manufacture a metal member for connecting the first reflective electrode 131 and the first pixel electrode 311, so that the manufacturing process of the display panel can be simplified and the manufacturing cost can be reduced.

Further, in order to improve the preparation accuracy of the pixel electrode layer and further reduce the intervals between the first pixel electrodes 311, the pixel electrode layer may be prepared by following method.

Figure 6:
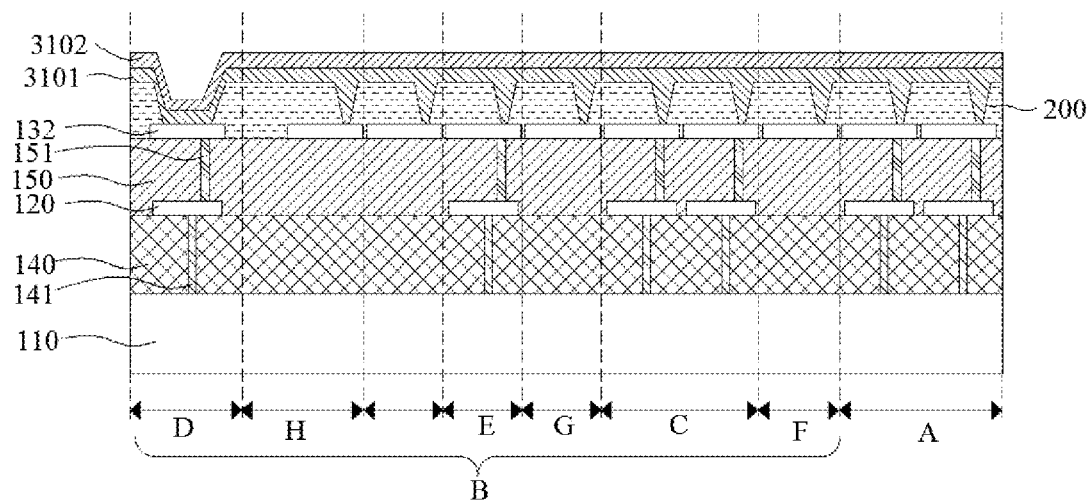
FIG. 6 is a schematic structural view of forming a first photoresist layer and an anti-reflection layer according to an embodiment of the present disclosure.

As shown in FIG. 6, an anti-reflection layer 3101 and a first photoresist layer 3102 are sequentially formed at a side of the transparent insulating layer 200 far away from the driving circuit layer 110.

Figure 7:
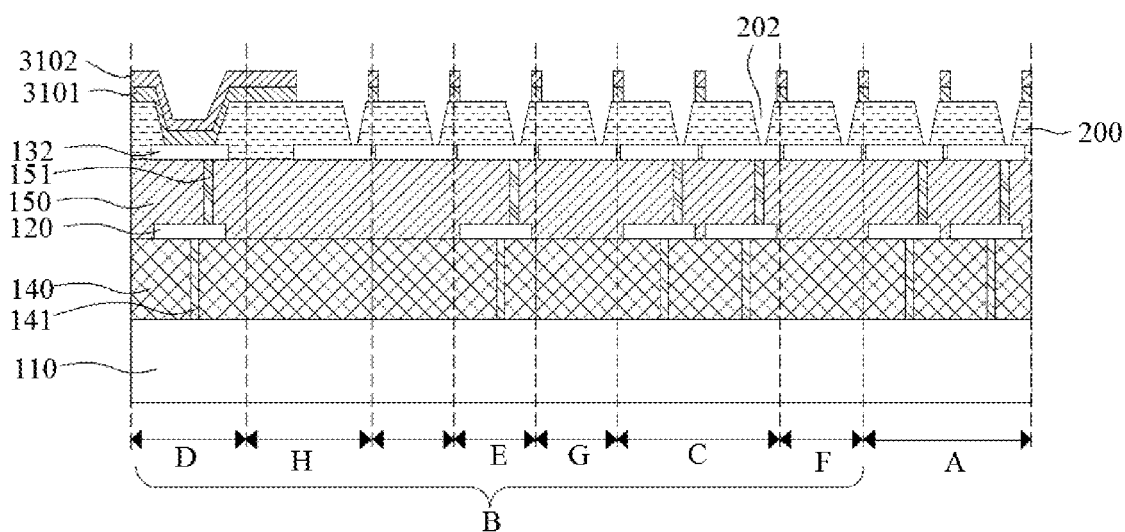
FIG. 7 is a schematic structural view of patterning a first photoresist layer and an anti-reflection layer according to an embodiment of the present disclosure.

Next, as shown in FIG. 7, the anti-reflection layer 3101 and the first photoresist layer 3102 are exposed and developed to remove the anti-reflection layer 3101 and the first photoresist layer 3102 at the pixel electrode layer to be formed, for example, the anti-reflection layer 3101 and the first photoresist layer 3102 at a position corresponding to the first pixel electrode 311 are removed. In other words, the orthographic projections of residual anti-reflection layer 3101 and the first photoresist layer 3102 on the reflective electrode layer may be complementary to the orthographic projection of the pixel electrode layer on the reflective electrode layer.

Figure 8:
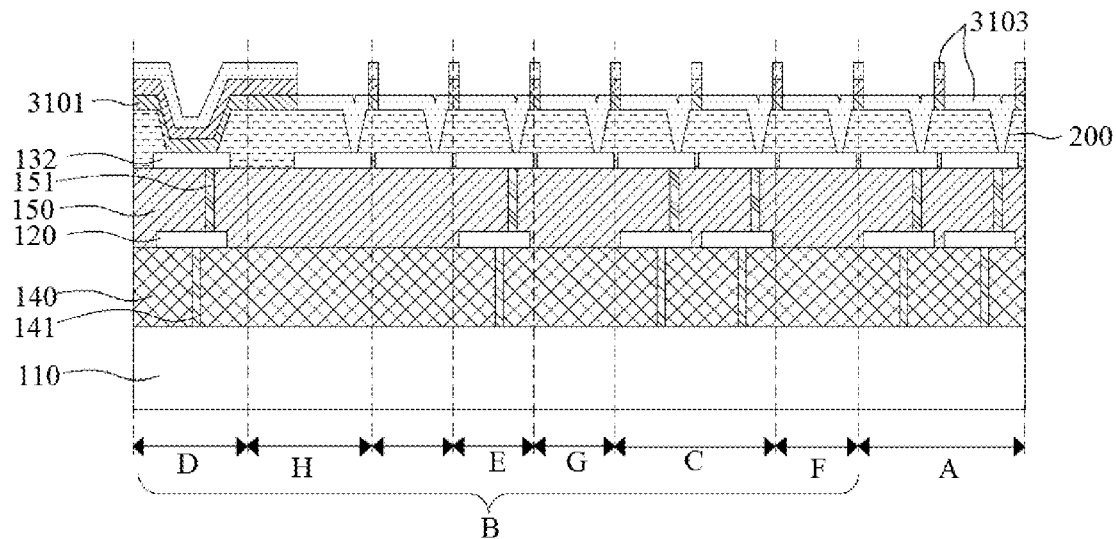
FIG. 8 is a schematic structural view of forming a pixel electrode material layer according to an embodiment of the present disclosure.

Furthermore, as shown in FIG. 8, a conductive material is deposited at a side of the anti-reflection layer 3101 and the first photoresist layer 3102 far away from the driving circuit layer 110 to form a pixel electrode material layer 3103; a part of the conductive material is deposited on the surface of the residual first photoresist layer 3102 far away from the driving circuit layer 110, and a part of the conductive material is deposited in a gap between the residual anti-reflection layer 3101 and the first photoresist layer 3102.

Figure 9:
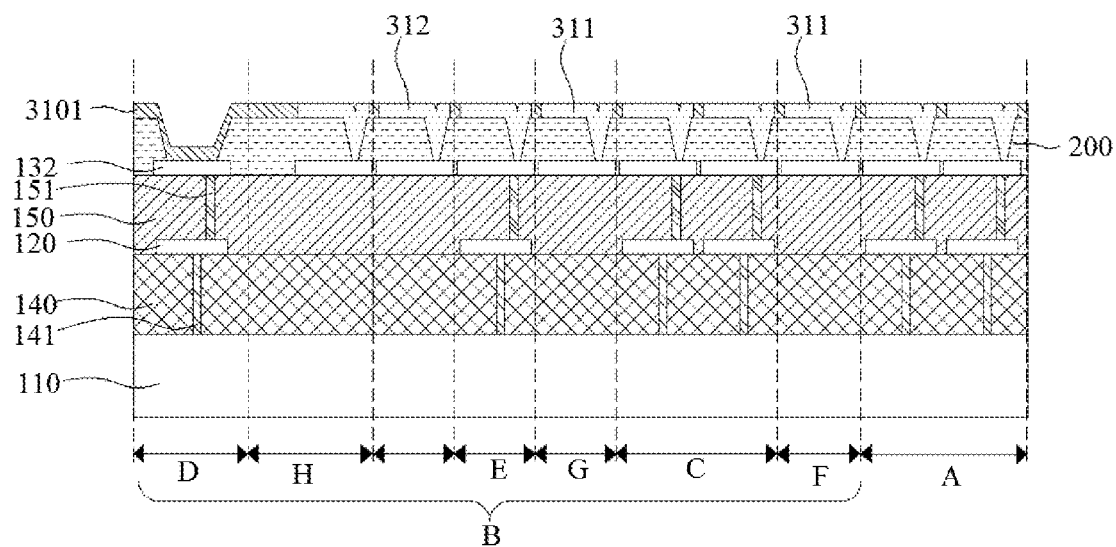
FIG. 9 is a schematic structural view of stripping a first photoresist layer according to an embodiment of the present disclosure.

Furthermore, as shown in FIG. 9, the first photoresist layer 3102 is stripped, to strip the conductive material deposited on the residual first photoresist layer 3102, and pattern the pixel electrode material layer 3103, so as to obtain a pixel electrode layer.

Figure 10:
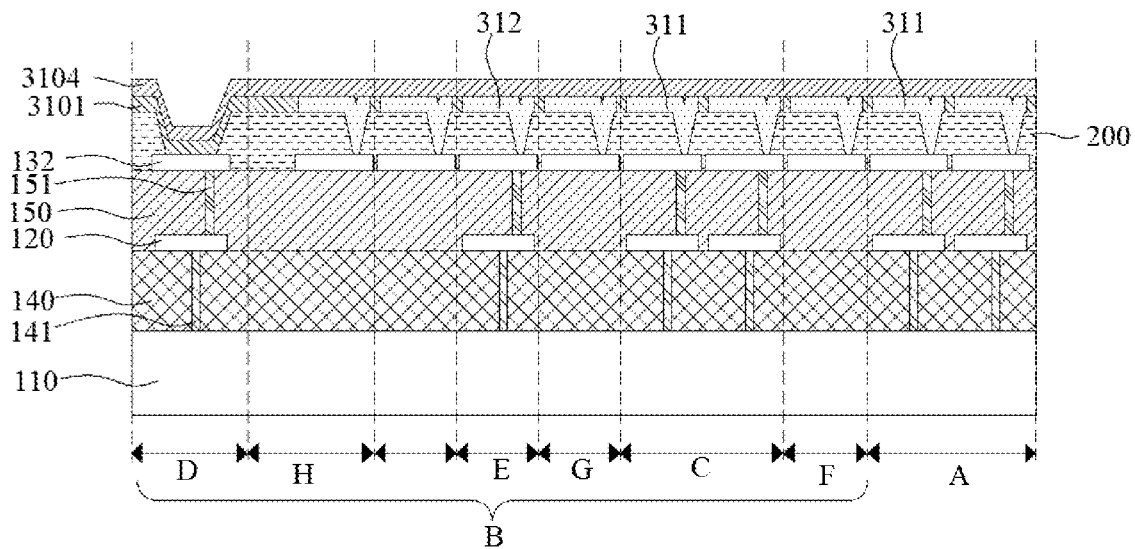
FIG. 10 is a schematic structural view of forming a second photoresist layer according to an embodiment of the present disclosure.

Furthermore, as shown in FIG. 10, a second photoresist layer 3104 is formed at a side of the residual anti-reflection layer 3101 and the pixel electrode layer far away from the driving circuit layer 110.

Figure 11:
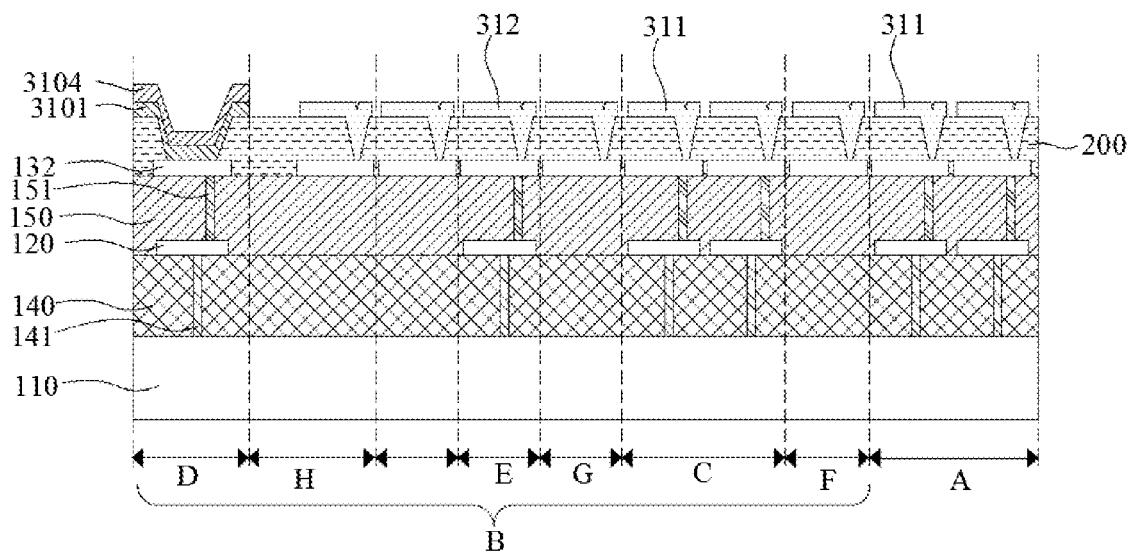
FIG. 11 is a schematic structural view of patterning a second photoresist layer according to an embodiment of the present disclosure.

Furthermore, as shown in FIG. 11, the second photoresist layer 3104 and the residual anti-reflection layer 3101 are exposed and developed to remove the second photoresist layer 3104 and the residual anti-reflection layer 3101 outside the binding area D. In this way, after exposure and development, the second reflective electrode 132 of the binding area D is covered and protected by the anti-reflection layer 3101 and the second photoresist layer 3104. The anti-reflection layer 3101, the first photoresist layer 3102 and the second photoresist layer 3104 in the display area A are removed.

Accordingly, when preparing the pixel electrode layer, the anti-reflection layer 3101 is formed and then the first photoresist layer 3102 is formed. The anti-reflection layer 3101 can reduce reflection of the light during exposure, thereby improving the exposure accuracy and improving the preparation accuracy of the pixel electrode layer. The preparation accuracy of the pixel electrode layer is improved in order to reduce the intervals between the first pixel electrodes 311.

An orthographic projection of the connection via hole 202 on the pixel electrode layer is located within the corresponding first pixel electrode 311; and a minimum value of a distance between any point of the orthographic projection of the connection via hole 202 on the pixel electrode layer and any point of an edge of the corresponding first pixel electrode 131 is not less than the first threshold value N, that is, a distance between the orthographic projection of the connection via hole 202 on the pixel electrode layer and the edge of the first pixel electrode is not less than the first threshold value N. In other words, a closed confined area may be included within any one of the first pixel electrodes 311, and a minimum value of a distance between any point of an edge of the confined area and any point of the edge of the first pixel electrode 311 is the first threshold value N; and the orthographic projection of the connection via hole 202 on the first pixel electrode 311 is completely located within the confined area of the first pixel electrode 311.

Optionally, a minimum value of the distance between any point of the orthographic projection of the connection via hole 202 on the pixel electrode layer and any point of the edge of the corresponding first pixel electrode is equal to the first threshold value, that is, the orthographic projection of the connection via hole 202 on the pixel electrode layer is located within the corresponding first pixel electrode 311, and a distance d1 between the orthographic projection of the connection via hole 202 on the pixel electrode layer and the edge of the corresponding first pixel electrode 311 is the first threshold value N.

Further, the first pixel electrode 311 at least has a first edge and a second edge adjacent to each other. A minimum value of a distance between any point of the orthographic projection of the connection via hole 202 on the pixel electrode layer and any point of the first edge of the corresponding first pixel electrode 311 is equal to the first threshold value N; and a minimum value of a distance between any point of the orthographic projection of the connection via hole 202 on the pixel electrode layer and any point of the second edge of the corresponding first pixel electrode 311 is equal to the first threshold value N. That is, the first pixel electrode 311 at least has a first edge and a second edge adjacent to each other, and a distance between the orthographic projection of the connection via hole 202 on the pixel electrode layer and the first edge is the first threshold value N; and a distance between the orthographic projection of the connection via hole 202 on the pixel electrode layer and the second edge is the first threshold value N. That is, referring to FIG. 4, the interval d1 in FIG. 4 may be equal to the first threshold value N. In this way, the orthographic projection of the connection via hole 202 on the first pixel electrode 311 may be close to the edge of the first pixel electrode 311 as possible, and the uneven surface of the first pixel electrode 311 may be close to the edge of the first pixel electrode 311, so as to reduce the influence of the connection via hole 202 on the luminous uniformity of the light-emitting device.

In an embodiment of the present disclosure, the first threshold value N may also be determined according to the size of the first pixel electrode. Optionally, a minimum distance between any point on the edge of the first pixel electrode 311 and a center o of the first pixel electrode 311 is a third distance d3. The first threshold value N is in a range of 5%-8% of the third distance d3. In this way, the orthographic projection of the connection via hole 202 on the first pixel electrode 311 may be close to the edge of the first pixel electrode 311 as possible, thus achieve a balance between ensuring the light-emitting effect of the light-emitting device and improving a yield of the display panel.

In another embodiment of the present disclosure, a distance between a center of the orthographic projection of the connection via hole 202 on the pixel electrode layer and one specific edge of the corresponding first pixel electrode 311 is not greater than a distance between a center of the orthographic projection of the connection via hole 202 on the pixel electrode layer and another edges of the corresponding first pixel electrode 311. A distance between the center of the orthographic projection of the connection via hole 202 on the pixel electrode layer and the specific edge is a fourth distance; and a distance between the specific edge and a center of the first pixel electrode 311 is a fifth distance; and the fourth distance is 8%-14% of the fifth distance. The specific edge is one of the edges of the first pixel electrode 311 closest to the orthographic projection of the connection via hole 202 on the first pixel electrode 311. In this way, in the case that poor connection of the connection via hole 202 caused by etching alignment offset can be reduced, the connection via hole 202 may be close to the edge of the first pixel electrode 311 as possible, so as to achieve the balance between ensuring the light-emitting effect of the light-emitting device and improving the yield of the display panel.

In another embodiment of the present disclosure, the first threshold value N may also be determined according to the alignment accuracy in a preparation process of the first pixel electrode layer. Optionally, the first threshold value N may be set as the alignment accuracy. In this way, in the case that the conductive material in the connection via hole 202 is ensured not to be etched, the orthographic projection of the connection via hole 202 on the first pixel electrode 311 may be close to the edge of the first pixel electrode 311 as possible, so as to achieve the balance between ensuring the light-emitting effect of the light-emitting device and improving the yield of the display panel. Optionally, the first threshold value N is 100-300 nm. Optionally, the first threshold value N is 100-200 nm.

Optionally, the orthographic projection of the first metal connector 151 electrically connected to the first pixel electrode 311 on the pixel electrode layer is located within the first pixel electrode 311, and does not completely overlap with the orthographic projection of the connection via hole 202 on the pixel electrode layer. In this way, it is possible to avoid poor contact between the first reflective electrode 131 and the first pixel electrode 311 caused by alignment offset as preparing the first reflective electrode 131, and to ensure that the first reflective electrode 131 can completely cover the first metal connector 151, and further ensure that the first metal connector 151 can be electrically connected with the first pixel electrode 311 through the first reflective electrode 131. Not only that, it could avoid the uneven surface probably produced by the first metal connector 151 from affecting the connection via hole 202, and improve connection strength of a combination surface between the first pixel electrode 311 in the connection via hole 202 and the first reflective electrode 131, and reduce contact resistance therebetween.

Optionally, a minimum value of the distance between any point of the orthographic projection of the connection via hole 202 on the pixel electrode layer and any point of an edge of the corresponding first pixel electrode 311 is equal to the first distance; a minimum distance between any point of the orthographic projection of the first metal connector 151 on the pixel electrode layer and any point of the edge of the first pixel electrode 311 electrically connected by the first metal connector 151 is equal to the second distance; and the second distance is smaller than the first distance. In this way, the orthographic projection of the first metal connector 151 on the pixel electrode layer may also be close to the edge of the first pixel electrode 311, so as to avoid the first metal connector 151 from generating an uneven surface in a middle position of the first pixel electrode 311, and further ensure the light-emitting effect of the light-emitting device.

Optionally, the orthographic projection of the first metal connector 151 on the pixel electrode layer is located within the first pixel electrode 311 electrically connected by the first metal connector 151; a minimum value of the distance between any point of the orthographic projection of the first metal connector 151 on the pixel electrode layer and any point of the edge of the first pixel electrode 311 electrically connected by the first metal connector 151 is not greater than the second threshold value; and the second threshold value is less than the first threshold value N. It could be interpreted that the second threshold value is not less than 0. In this way, the orthographic projection of the first metal connector 151 on the pixel electrode layer may also be close to the edge of the first pixel electrode 311, so as to avoid the first metal connector 151 from generating an uneven surface in the middle position of the first pixel electrode 311, and further ensure the light-emitting effect of the light-emitting device.

Optionally, as shown in FIG. 3, the first pixel electrode 311 has a hexagonal pattern. Optionally, as shown in FIG. 4 and FIG. 5, the first pixel electrode 311 is a centrally symmetrical hexagon, and the first pixel electrode 311 includes six side walls having two first side walls 3111 opposite to each other and four second side walls 3112 connected with the two first side walls 3111, and the four second side walls 3112 have the same length. The four second side walls 3112 form a first vertex angle 3113 and a second vertex angle 3114 which are arranged opposite to each other. Further Optionally, in the first pixel electrode 311, a distance between the two first side walls 3111 is 3.8-4.3 microns, and a distance between the first vertex and the second vertex is 4.8-5.4 microns.

Optionally, as shown in FIG. 3, the orthographic projection of the center of the first pixel electrode 311 on the reflective electrode layer coincide with a center of the corresponding first reflective electrode 131, in this way, the best reflection effect of each first reflection electrode 131 can be ensured. Further, the first reflective electrode 131 is a centrally symmetrical hexagon, and side walls of the first pixel electrodes 311 are arranged in parallel with side walls of the corresponding first reflective electrode 131 in one-to-one correspondence.

Optionally, as shown in FIG. 3, the orthographic projection of the first pixel electrode 311 on the reflective electrode layer is located within the corresponding first reflective electrode 131. Further, a distance between an edge of the orthographic projection of the first pixel electrode 311 on the reflective electrode layer and the edge of the corresponding first reflective electrode 131 is 0.2-0.5 microns.

Figure 12:
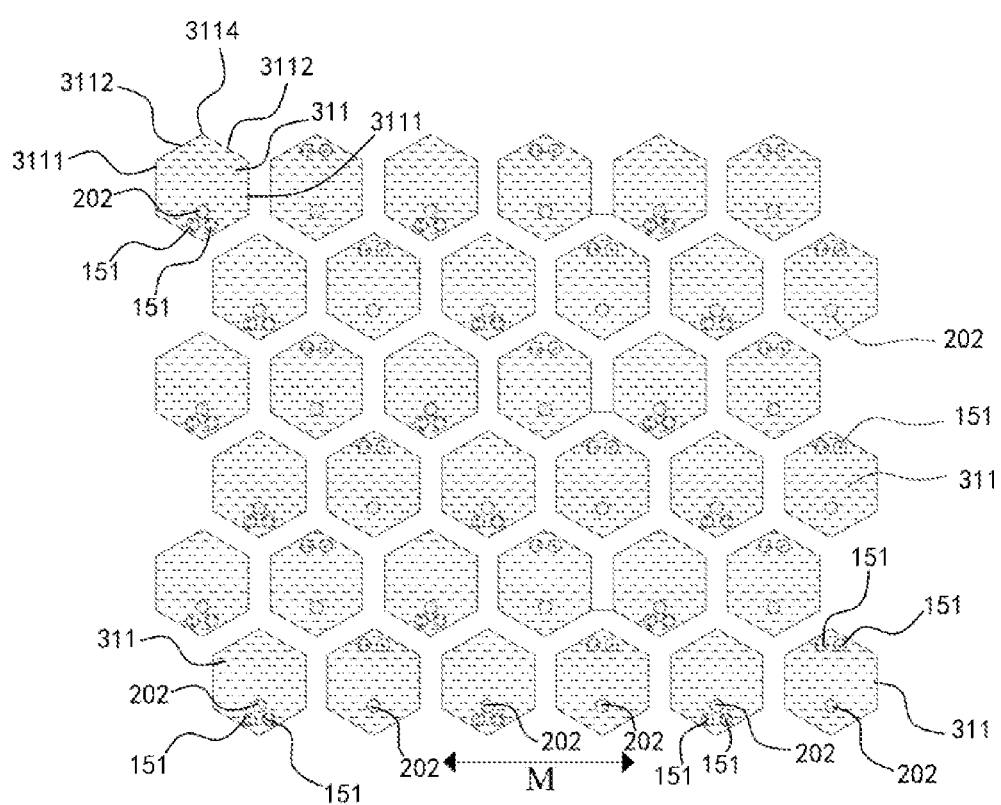
FIG. 12 is a schematic arrangement structure view of first pixel electrodes according to an embodiment of the present disclosure.

Optionally, as shown in FIG. 12, the orthographic projection of the first pixel electrode 311 on the driving circuit layer is a centrally symmetrical hexagon, and intervals among three first pixel electrodes 311 adjacent to one another are the same, so that the first pixel electrodes 311 are arranged in a honeycomb shape. The first pixel electrodes 311 are formed with a plurality of first pixel electrode rows along a row direction M. In this way, an arrangement density of the first pixel electrodes can be improved, and the display effect of the display panel can be improved by a pixel borrowing algorithm.

Optionally, in the same first pixel electrode row, the orthographic projections of the connection via hole 202 on the corresponding first pixel electrode 311 are located on the same straight line, so that the connection via holes 202 corresponding to the first pixel electrodes 311 are located on the same straight line. An orthographic projection position of the first metal connector 151 electrically connected to one of the first pixel electrodes 311 on the first pixel electrode 311 has a symmetrical relationship, for example, an axisymmetric relationship or a central symmetrical relationship, between two first pixel electrodes adjacent to each other in the first pixel electrode row. As an example, two first metal connectors 151 that are spaced apart by one first pixel electrode 311 and electrically connected to the first pixel electrodes 311 are located on the same straight line along the row direction M; and two first metal connectors 151 that are arranged adjacent to one another and electrically connected to the first pixel electrodes 311 are not located on the same straight line along the row direction M.

In an embodiment of the present disclosure, as shown in FIG. 12, the first pixel electrodes 311 are centrally symmetrical hexagon, and each first pixel electrode 311 is arranged in a honeycomb shape. The first pixel electrode 311 is formed with a plurality of first pixel electrode rows along the row direction M. Any one of the first pixel electrodes 311 includes two first side walls 3111 opposite to each other and four second side walls 3112 connected with the two first side walls 3111, both of the two first side walls 3111 are perpendicular to the row direction M, and the four second side walls 3112 have the same length. The four second side walls 3112 enclose a first vertex angle 3113 and a second vertex angle 3114 which are arranged opposite to each other. A minimum value of the distance between any point of the orthographic projection of the connection via hole 202 on the corresponding first pixel electrode 311 and any point on any one of the two second side walls 3112 of the first vertex angle 3113 of the first pixel electrode 311 is equal to the first threshold value N. In other words, the distance between the orthographic projection of the connection via hole 202 on the corresponding first pixel electrode 311 and the two second side walls 3112 of the first vertex angle 3113 is the first threshold value N.

Optionally, orthogonal projection positions of the connection via holes 202 on the corresponding first pixel electrodes 311 are arranged in the same way in two first pixel electrodes adjacent to each other in the first pixel electrode row. That is, the orthographic projections of the first metal connectors on the first pixel electrodes in the first pixel electrode rows are arranged in a row.

Optionally, the orthographic projection position of the first metal connector 151 electrically connected to one first pixel electrode 311 on the first pixel electrode 311 has a symmetrical relationship in the two first pixel electrodes adjacent to each other in the first pixel electrode row. Optionally, the orthographic projection position of the first metal connector 151 electrically connected to one first pixel electrode 311 on the first pixel electrode 311 has a centrally symmetrical relationship in the two first pixel electrodes adjacent to each other in the first pixel electrode row. That is, the orthographic projections of the first metal connectors on the first pixel electrodes in the first pixel electrode rows are alternately arranged.

Optionally, the orthographic projection of the first metal connector 151 on the pixel electrode layer is located within the first pixel electrode 311 electrically connected with the first metal connector 151, and a distance from the vertex of the first vertex angle 3113 or the vertex of the second vertex angle 3114 is greater than a distance among the vertexes of other vertex angles of the first pixel electrode 311. That is, the orthographic projection of the first metal connector 151 on the pixel electrode layer is close to the first vertex angle 3113 or the second vertex angle 3114 of the first pixel electrode 311 electrically connected by the first metal connector 151.

For example, in the two first pixel electrodes 311 adjacent to each other in the same first pixel electrode row, a distance between the orthographic projection of the first metal connector 151 electrically connected to one first pixel electrode 311 on the first pixel electrode 311 and the vertex of the first vertex angle 3113 of the first pixel electrode 311 is greater than a distance between the orthographic projection of the first metal connector 151 electrically connected to one first pixel electrode 311 on the first pixel electrode 311 and the vertexes of other vertex angles of the first pixel electrode 311. A distance between the orthographic projection of the first metal connector 151 electrically connected to another first pixel electrode 311 on the first pixel electrode 311 and the vertex of the second vertex angle 3114 of the first pixel electrode 311 is greater than a distance between the orthographic projection of the first metal connector 151 electrically connected to another first pixel electrode 311 on the first pixel electrode 311 and the vertexes of other vertex angles of the first pixel electrode 311. That is, in the same first pixel electrode row, two first metal connectors 151 that are spaced apart by one first pixel electrode 311 and electrically connected to the first pixel electrodes 311 are arranged close to the first vertex angle 3113 or the second vertex angle 3114, and two first metal connectors 151 that are adjacent to each other and electrically connected to the first pixel electrodes 311 are respectively close to the first vertex angle 3113 and the second vertex angle 3114. In this way, the process stability and the process feasibility in preparing the reflective electrode layer, the transparent insulating layer and the pixel electrode layer can be improved.

In an embodiment of the present disclosure, as shown in FIG. 1, a peripheral area B may further include a binding area D, and the reflective electrode layer further includes a second reflective electrode 132 disposed in the binding area D; and the second reflective electrode 132 is electrically connected with the metal wiring layer 120. The transparent insulating layer 200 is formed with a binding hole 201 that exposes at least part of an area of the second reflective electrode 132. In this way, the second reflective electrode 132 included in the reflective electrode layer of the present disclosure may serve as a bonding pad of the display panel as a signal input and output channel. Optionally, the pattern and the size of the second reflective electrode 132 are the same as those of the first reflective electrode 131, so as to improve the etching uniformity when the reflective electrode layer is formed by etching.

In an embodiment of the present disclosure, the peripheral area B may include a sensing area C, in which a sensing device may be formed. The sensing device is used to simulate and detect working conditions of the light-emitting devices in the display area A, and adjust the driving of the light-emitting devices according to simulation results, so that the light-emitting devices emit light more accurately. The reflective electrode layer includes a plurality of first reflective electrodes 131 in the sensing area C, and the first reflective electrodes 131 in the sensing area C are electrically connected with the metal wiring layer 120 through the first metal connectors 151. The pixel electrode layer includes a plurality of first pixel electrodes 311 in the sensing area C, and the first pixel electrodes 311 in the sensing area C are electrically connected with the first reflective electrodes 131 through the connection via holes.

In this way, the display panel is provided with the first reflective electrode 131, the first pixel electrode 311, and the organic light-emitting layer 320 and the common electrode layer 330 covering the first pixel electrode 311 in both the sensing area C and the display area A. The first pixel electrode 311, the organic light-emitting layer 320 and the common electrode layer 330 form a light-emitting device in the display area A; and a sensing device in the sensing area C; the light-emitting device and the sensing device are electrically connected with the metal wiring layer 120 through the first reflective electrodes 131, in this way, it is ensured that the light-emitting device and the sensing device are in the same electrical environment, the simulation test results of the sensing device are more matched with actual situations of the light-emitting device, to improve the accuracy of the simulation test results of the sensing device, and further improve the accuracy of the adjustment of the light-emitting device. Not only that, the reflective electrode layer forms the first reflective electrode 131 in the sensing area C, thereby reducing an etching amount in the sensing area C when the reflective electrode layer is patterned, shortening the etching time and ensuring the pattern accuracy of the first reflective electrode 131 in the display area A, so that the first reflective electrode 131 in the display area A can achieve better reflection effect and improve the brightness of the display panel.

In an embodiment of the present disclosure, as shown in FIG. 1, the peripheral area B may also include a cathode overlapping area E; the reflective electrode layer may further include a third reflective electrode 133 disposed in the cathode overlapping area E; the third reflective electrode 133 is electrically connected with the metal wiring layer 120; the third reflective electrode 133 may be directly or indirectly electrically connected with the common electrode layer 330 to provide a common voltage to the common electrode layer 330; and the third reflective electrode 133 is electrically connected with the metal wiring layer 120 and the common electrode layer 330, to avoid the problems of too large slope and too large sinking depth of the common electrode layer 330 when the common electrode layer 330 is directly connected with the metal wiring layer 120, reduce the preparation difficulty of the display panel, and improve the stability of the electrical connection between the metal wiring layer 120 and the common electrode layer 330. Optionally, the pattern and the size of the third reflective electrode 133 are the same as those of the first reflective electrode 131, so as to improve the etching uniformity when the reflective electrode layer is formed by etching.

Optionally, as shown in FIG. 1, the transparent insulating layer 200 is also provided with a plurality of connection via holes 202 in the cathode overlapping area E, and the connection via holes 202 in the cathode overlapping area E are arranged in one-to-one correspondence with the third reflective electrodes 133, wherein the connection via holes 202 may expose a part of areas of the corresponding third reflective electrodes 133. The pixel electrode layer may further include a plurality of second reflective electrodes 312 in the cathode overlapping area E, and the second reflective electrodes 312 are arranged in one-to-one correspondence with the connection via holes 202 and the third reflective electrodes 133, so that any one of the second reflective electrodes 312 is electrically connected with the corresponding third reflective electrode 133 through the corresponding connection via hole 202. The common electrode layer 330 is electrically connected with each second reflective electrode 312, so that the common electrode layer 330 is electrical connected with the metal wiring layer 120 through the second reflective electrode 312 and the third reflective electrode 133. Optionally, the pattern and the size of the second reflective electrode 312 are the same as those of the first pixel electrode 311, so as to improve the etching uniformity when the pixel electrode layer is formed by etching.

In an embodiment of the present disclosure, as shown in FIG. 1, the peripheral area B may further include a first auxiliary area F between the display area A and the sensing area C, a second auxiliary area G between the sensing area C and the cathode overlapping area E, and a third auxiliary area H between the cathode overlapping area E and the binding area D. The reflective electrode layer may also include first auxiliary electrodes in the first auxiliary area F, the second auxiliary area G and the third auxiliary area H; and the pattern and the size of each first auxiliary electrode are the same as those of the first reflective electrode 131, so as to ensure the etching uniformity when the reflective electrode layer is formed by etching and improve the preparation accuracy of the reflective electrode layer. The pixel electrode layer may also include second auxiliary electrodes in the first auxiliary area F, the second auxiliary area G and the third auxiliary area H; and the pattern and the size of each second auxiliary electrode are the same as those of the first pixel electrode 311, so as to ensure the etching uniformity when the pixel electrode layer is formed by etching and improve the preparation accuracy of the pixel electrode layer.

The first auxiliary electrodes and the second auxiliary electrodes are electrically connected in one-to-one correspondence or may be disconnected. For example, the transparent insulating layer 200 is also provided with connection via holes 202 in the first auxiliary area F, the second auxiliary area G and the third auxiliary area H, and these connection via holes 202 are arranged in one-to-one correspondence with the first auxiliary electrodes and the second auxiliary electrodes; and any one of the second auxiliary electrodes is electrically connected with the corresponding first auxiliary electrode through the corresponding connection via hole 202. In this way, structures of the reflective electrode layer and the pixel electrode layer in the auxiliary areas are the same as that in the display area A and the sensing area C, thereby ensuring the uniformity of the preparation of the reflective electrode layer and the pixel electrode layer.

In an embodiment of the present disclosure, as shown in FIG. 1, the light-emitting device layer may further include a pixel definition layer 340; the pixel definition layer 340 is disposed on a surface of the transparent insulating layer 200 far away from the drive backplane 100 and located in a gap between the first pixel electrodes 311; and an orthographic projection of the pixel definition layer 340 on the reflective electrode layer partially overlaps with the first reflective electrode 131. Since the pixel definition layer 340 is located in the gap between the first pixel electrodes 311, the pixel definition layer 340 does not shield the first pixel electrode 311, so that the display panel has a larger opening ratio and a higher brightness. The pixel definition layer 340 is located between the second emitting electrodes and covers a part of some of the first reflecting electrodes 131, thereby reducing light crosstalk between adjacent light-emitting devices and improving contrast of the display panel.

The organic light-emitting layer 320 is disposed at a side of the pixel electrode layer far away from the driving circuit layer 110, and covers the sensing area C and the display area A, to ensure uniform electrical environment of the sensing device and the light-emitting device and improve the accuracy of the simulation test results of the sensing area C. Optionally, the materials of sub-film layers of the organic light-emitting layer 320 may be sequentially evaporated through an open mask, so that the sub-film layers is an integral film layer. In an embodiment of the present disclosure, the organic light-emitting layer 320 may be a white light-emitting layer, so that the light-emitting device may emit white light. For example, the organic light-emitting layer 320 may include a red light-emitting material layer, a green light-emitting material layer and a blue light-emitting material layer which are laminated.

The common electrode layer 330 is disposed on a surface of the organic light-emitting layer 320 far away from the driving circuit layer 110, and may use a transparent conductive material, such as magnesium-silver alloy. In an embodiment of the present disclosure, the common electrode layer 330 may also cover the cathode overlapping area E, so as to cover the surface of the second reflective electrode 312 far away from the driving circuit layer 110 in the cathode overlapping area E, and realize the electrical connection with the metal wiring layer 120 through the second reflective electrode 312.

As shown in FIG. 1, the display panel provided by the present disclosure may further include a thin film encapsulation layer (TFE) 410, and the thin film encapsulation layer 410 may cover a side of the common electrode layer 330 far away from the driving circuit layer 110 and a side edge of the common electrode layer 330 so as to prevent moisture and oxygen from invading the organic light-emitting layer 320.

In an embodiment of the present disclosure, as shown in FIG. 1, the display panel provided by the present disclosure may further include a capping layer (CPL) 420, and the capping layer 420 is disposed on a surface of the common electrode layer 330 far away from the driving circuit layer 110, so as to improve the light emitting efficiency and further improve the brightness of the display panel.

In an embodiment of the present disclosure, as shown in FIG. 1, the display panel provided by the present disclosure may further include a color film layer 430, and the color film unit may be disposed at a side of the thin film encapsulation layer 410 far away from the driving circuit layer 110. The color film layer 430 may include color film units in different colors, and the color film units in the display area A may be arranged in one-to-one correspondence with the first pixel electrodes 311 in the display area A, so that the light emitted by the light-emitting device emits out through the corresponding color film unit, and the emitted-out light is filtered by the color film unit to present colorful.

Further, as shown in FIG. 1, the display panel may further include a black matrix layer 440 which is disposed at a side of the thin film encapsulation layer 410 far away from the driving circuit layer 110 and has a plurality of light transmission windows. The light-transmitting windows in the display area A are arranged in one-to-one correspondence with the first pixel electrodes 311 in the display area A, and are covered by the color film units in the display area A in one-to-one correspondence. In the sensing area C, the black matrix layer 440 may not be provided with a light transmission window, so that each sensing device in the sensing area C is covered by the black matrix layer 440; in this way, even if the sensing device emits light, the emitted light cannot be emitted out.

Optionally, as shown in FIG. 1, a protective layer 450 may also be provided at as side of the color film layer 430 and the black matrix layer 440 far away from the driving circuit layer 110. Optionally, the material and the structure of the protective layer 450 are the same as those of the thin film encapsulation layer 410.

As shown in FIG. 1, the display panel provided by the present disclosure may further include a cover plate 460, and the cover plate 460 is located at another side of the display panel relative to the driving circuit layer 110, so that the film layers such as a light-emitting device layer are located between the cover plate 460 and the driving circuit layer 110, so as to further protect the organic light-emitting layer 320 and improve service life and stability of the organic light-emitting layer 320. Optionally, the cover plate 460 may be a glass cover plate 460.

Embodiments of the present disclosure also provide a display device, which includes any one of the display panels described in the above-mentioned embodiments. The display device may be AR glasses, VR glasses or other types of display devices. Since the display device has any one of the display panels described in the above embodiments, it has the same advantageous effects, which will not be repeated herein.

It should be understood that application of the present disclosure is not limited to the detailed structure and arrangement of components provided in the present specification. This disclosure can have other embodiments, and can be implemented and carried out in various ways. The foregoing variations and modifications fall within the scope of the present disclosure. It should be understood that this disclosure disclosed and defined in this specification may extend to all alternative combinations of two or more of the individual features that are mentioned or apparent from the text and/or drawings. All of these different combinations form various alternative aspects of the present disclosure. The embodiments described herein explain the best modes known for carrying out the present disclosure, and will allow those skilled in the art to utilize this disclosure.

What is claimed is:

1. A display panel comprising:
a drive backplane comprising a driving circuit layer, a metal wiring layer, a first insulating layer and a reflective electrode layer sequentially laminated; wherein the first insulating layer has a plurality of first via holes, and each of the plurality of first via holes is provided with a first metal connector; the reflective electrode layer comprises a plurality of first reflective electrodes, the plurality of first reflective electrodes are respectively electrically connected with the metal wiring layer through the first metal connector;
a transparent insulating layer at a side of the reflective electrode layer far away from the driving circuit layer; wherein the transparent insulating layer has a plurality of connection via holes corresponding to the plurality of first reflective electrodes one by one, and any one of the plurality of connection via holes exposes a part of a surface of corresponding one of the plurality of first reflective electrodes;
a light-emitting device layer comprising a pixel electrode layer, an organic light-emitting layer and a common electrode layer sequentially laminated at a side of the transparent insulating layer far away from the reflective electrode layer; wherein the pixel electrode layer comprises a plurality of first pixel electrodes corresponding to the plurality of the connection via holes one by one, and each of the plurality of first pixel electrodes is connected with a corresponding one of the plurality of first reflective electrodes through a corresponding one of the plurality of connection via holes;
wherein an orthographic projection of a connection via hole of the plurality of connection via holes on the pixel electrode layer is within a corresponding one of the plurality of first pixel electrodes; a minimum value of a distance between any point of the orthographic projection of the connection via hole on the pixel electrode layer and any point of an edge of the corresponding one of the plurality of first pixel electrodes is not less than a first threshold value; and the first threshold value is between 0.13 times and 1.3 times of a distance between two adjacent ones of the plurality of first pixel electrodes.

2. The display panel according to claim 1, wherein the minimum value of the distance between any point of the orthographic projection of the connection via hole on the pixel electrode layer and any point of the edge of the corresponding one of the plurality of first pixel electrodes is equal to the first threshold value.

3. The display panel according to claim 1, wherein each first pixel electrode of the plurality of first pixel electrodes at least has a first edge and a second edge adjacent to each other; the minimum value of the distance between any point of the orthographic projection of the connection via hole on the pixel electrode layer and any point of the first edge of the corresponding one of the plurality of first pixel electrodes is equal to the first threshold value; and the minimum value of the distance between any point of the orthographic projection of the connection via hole on the pixel electrode layer and any point of the second edge of the corresponding one of the plurality of first pixel electrodes is equal to the first threshold value.

4. The display panel according to claim 1, wherein a minimum value of a distance between any point on an edge of a first pixel electrode of the plurality of first pixel electrodes and a center of the first pixel electrode is a third distance; and
the first threshold value is within a range of 5%-8% of the third distance.

5. The display panel according to claim 1, wherein an orthographic projection of the first metal connector electrically connected to a corresponding one of the plurality of first pixel electrodes on the pixel electrode layer is within the corresponding one of the plurality of first pixel electrodes and does not completely overlap with the orthographic projection of the connection via hole on the pixel electrode layer.

6. The display panel according to claim 5, wherein the minimum value of the distance between any point of the orthographic projection of the connection via hole on the pixel electrode layer and any point of the edge of the corresponding one of the plurality of first pixel electrodes is equal to a first distance;

a minimum value of a distance between any point of the orthographic projection of the first metal connector on the pixel electrode layer and any point of an edge of the corresponding one of the plurality of first pixel electrodes electrically connected to the first metal connector is equal to a second distance; and the second distance is smaller than the first distance.

7. The display panel according to claim 1, wherein an orthographic projection of the first metal connector on the pixel electrode layer is within a corresponding one of the first pixel electrodes electrically connected to the first metal connector; a minimum value of a distance between any point of the orthographic projection of the first metal connector on the pixel electrode layer and any point of an edge of the corresponding one of the first pixel electrodes electrically connected to the first metal connector is not greater than a second threshold value; and the second threshold value is less than the first threshold value.

8. The display panel according to claim 1, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

9. The display panel according to claim 8, wherein orthographic projections of a plurality of first metal connectors on the first pixel electrodes in the plurality of first pixel electrode rows are alternately arranged.

10. The display panel according to claim 9, wherein the orthographic projections of the plurality of first metal connectors on the first pixel electrodes in the plurality of first pixel electrode rows are arranged in a row.

11. The display panel according to claim 1, wherein the pixel electrode layer comprises a first titanium metal layer, a first aluminum metal layer, a second titanium metal layer, and a molybdenum metal layer sequentially laminated on a surface of the transparent insulating layer far away from the driving circuit layer; wherein the first titanium metal layer has a thickness of 80-120 angstroms, the first aluminum metal layer has a thickness of 400-500 angstroms, the second titanium metal layer has a thickness of 40-60 angstroms, and the molybdenum metal layer has a thickness of 40-60 angstroms.

12. The display panel according to claim 1, wherein the reflective electrode layer comprises a third titanium metal layer, a second aluminum metal layer, and a titanium nitride layer sequentially laminated on a surface of the first insulating layer far away from the metal wiring layer; wherein the third titanium metal layer has a thickness of is 80-120 angstroms, the second aluminum metal layer has a thickness of 700-900 angstroms, and the titanium nitride layer has a thickness of 80-120 angstroms.

13. The display panel according to claim 1, wherein a diameter of the connection via hole is 0.2-0.4 microns.

14. A display device comprising the display panel according to claim 1.

15. The display panel according to claim 2, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

16. The display panel according to claim 3, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

17. The display panel according to claim 4, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

18. The display panel according to claim 5, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

19. The display panel according to claim 6, wherein an orthographic projection of each first pixel electrode of the plurality of first pixel electrodes on the driving circuit layer is a centrally symmetrical hexagon, and the plurality of the first pixel electrodes are arranged in a honeycomb shape; the plurality of the first pixel electrodes form a plurality of first pixel electrode rows along a row direction;

each first pixel electrode of the plurality of first pixel electrodes comprises two first side walls opposite to one another and four second side walls connected with two said first side walls; two said first side walls are perpendicular to the row direction; four said second side walls enclose a first vertex angle and a second vertex angle opposite to one another;

a minimum value of a distance between any point of the orthographic projection of the connection via hole on the corresponding one of the plurality of first pixel electrodes and any point on any one of the two said second side walls of the first vertex angle of the corresponding one of the plurality of first pixel electrodes is equal to the first threshold value.

\* \* \* \* \*